US009362885B2

(12) United States Patent
Ariji et al.

(10) Patent No.: US 9,362,885 B2
(45) Date of Patent: Jun. 7, 2016

(54) PIEZOELECTRIC DEVICE

(71) Applicant: NIHON DEMPA KOGYO CO., LTD., Tokyo (JP)

(72) Inventors: Takumi Ariji, Saitama (JP); Hiromasa Nakatake, Saitama (JP); Takehiro Takahashi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 428 days.

(21) Appl. No.: 14/069,378

(22) Filed: Nov. 1, 2013

(65) Prior Publication Data

US 2014/0139073 A1 May 22, 2014

(30) Foreign Application Priority Data

Nov. 19, 2012 (JP) ................................. 2012-253341

(51) Int. Cl.
| | |
|---|---|
| H01L 41/047 | (2006.01) |
| H01L 41/053 | (2006.01) |
| H03H 9/13 | (2006.01) |
| H03H 9/05 | (2006.01) |
| H03H 9/10 | (2006.01) |
| H03H 9/17 | (2006.01) |

(52) U.S. Cl.
CPC ............. *H03H 9/131* (2013.01); *H03H 9/0595* (2013.01); *H03H 9/1035* (2013.01); *H03H 9/17* (2013.01)

(58) Field of Classification Search
USPC .................................................. 310/311–371
See application file for complete search history.

(56) References Cited

U.S. PATENT DOCUMENTS

| | | | | |
|---|---|---|---|---|
| 2002/0074904 A1* | 6/2002 | Watanabe | .......... | H03H 9/14538 310/364 |
| 2011/0241800 A1* | 10/2011 | Yokoyama | ............... | H03H 3/04 333/188 |
| 2011/0260585 A1* | 10/2011 | Ichikawa | ............. | H03H 9/1035 310/344 |
| 2013/0049541 A1* | 2/2013 | Amano | ................ | H03H 9/1035 310/340 |
| 2013/0241362 A1* | 9/2013 | Ichikawa | ............. | H01L 41/047 310/367 |
| 2014/0252919 A1* | 9/2014 | Ariji | .................. | H01L 41/0533 310/344 |
| 2014/0265735 A1* | 9/2014 | Asano | .................. | H03H 9/1021 310/365 |
| 2014/0368089 A1* | 12/2014 | Omomo | .................... | H03H 3/02 310/348 |
| 2015/0015118 A1* | 1/2015 | Kamijo | ................ | H03H 9/1021 310/344 |
| 2015/0015119 A1* | 1/2015 | Takahashi | ................ | H03H 9/17 310/348 |
| 2015/0035410 A1* | 2/2015 | Mizusawa | ................ | H03H 9/17 310/321 |
| 2015/0155469 A1* | 6/2015 | Ariji | .................... | H03H 9/1021 310/344 |

FOREIGN PATENT DOCUMENTS

| | | | | |
|---|---|---|---|---|
| DE | 10046515 A1 * | 6/2001 | ............... | H03H 3/08 |
| JP | 2010-200118 | 9/2010 | | |

* cited by examiner

*Primary Examiner* — Thomas Dougherty
(74) *Attorney, Agent, or Firm* — Jianq Chyun IP Office

(57) ABSTRACT

A piezoelectric device includes a piezoelectric vibrating piece, a lid portion, and a base portion. The piezoelectric vibrating piece includes: a vibrating portion; a framing portion surrounding the vibrating portion; an excitation electrode in the vibrating portion; and an extraction electrode electrically connected to the excitation electrode in the framing portion. The lid portion is bonded to a front surface of the piezoelectric vibrating piece via a bonding material. The base portion includes an external electrode bonded to a back surface of the piezoelectric vibrating piece via a bonding material and electrically connected to the extraction electrode. The excitation electrode and the extraction electrode each include: a foundation film formed of metal to be rendered passive; and a first metal film and a second metal film laminated to the foundation film. The foundation film has a film thickness of 1.0 nm to 8.0 nm.

5 Claims, 6 Drawing Sheets

PIEZOELECTRIC DEVICE

CROSS REFERENCE TO RELATED APPLICATIONS

This application claims the priority benefit of Japan application serial no. 2012-253341, filed on Nov. 19, 2012. The entirety of the above-mentioned patent application is hereby incorporated by reference herein and made a part of this specification.

TECHNICAL FIELD

This disclosure relates to a piezoelectric device.

DESCRIPTION OF THE RELATED ART

In a known type of piezoelectric device, a lid portion is bonded to a front surface (one principal surface) of a piezoelectric vibrating piece such as a quartz crystal piece via a bonding material, while a base portion is bonded to a back surface (the other principal surface) similarly via a bonding material. The piezoelectric vibrating piece used in this type includes a vibrating portion that vibrates at a predetermined vibration frequency, a framing portion formed to surround the vibrating portion, and a connecting portion that connects the vibrating portion and the framing portion together. At the front surface and the back surface of the vibrating portion of the piezoelectric vibrating piece, respective excitation electrodes are formed and respective extraction electrodes are formed from the respective excitation electrodes to the framing portion. These extraction electrodes electrically connect to respective external electrodes of the base portion.

For example, Japanese Unexamined Patent Application Publication No. 2010-200118 (hereinafter referred to as Patent Literature 1) discloses a piezoelectric device where a piezoelectric vibrating piece that includes respective extraction electrodes extracted from excitation electrodes to a framing portion is sandwiched between a lid portion and a base portion. The extraction electrodes included in this piezoelectric vibrating piece are formed as far as the outermost periphery of the framing portion. Even in a state where the lid portion and the base portion are bonded to the piezoelectric vibrating piece (that is, in a completed state as the piezoelectric device), side surfaces of the extraction electrodes are exposed to the exterior.

In the piezoelectric device disclosed in Patent Literature 1, the side surfaces of the extraction electrodes are exposed to the exterior. Accordingly, these side surfaces are exposed to the outside air. The metal used in the extraction electrode may be corroded (dissolved) by water vapor in the atmosphere. This corrosion may cause damage of the piezoelectric device. For example, bonding strength of the piezoelectric vibrating piece to the lid portion and the base portion is reduced, and the lid portion and the base portion are peeled off from the piezoelectric vibrating piece. Generally, the internal space (the space where the vibrating portion is held) of the piezoelectric device is formed under a predetermined atmosphere, for example, is vacuumed. However, the outside air invades the internal space via a corroded extraction electrode. This may lead to reduction in reliability of the piezoelectric device such as variation in vibration frequency or cause of damage on the excitation electrode.

Like Patent Literature 1, in the type of piezoelectric device where the piezoelectric vibrating piece is sandwiched between the lid portion and the base portion, the excitation electrodes of the vibrating portion and the extraction electrodes of the framing portion are formed approximately at the same time. Therefore, to prevent the corrosion of the extraction electrodes or similar trouble, it is considered to form these electrodes in a laminated structure constituted of a plurality of metal films. However, this may cause influence on the vibration characteristic of the vibrating portion or increase in resistance value (CI value) depending on the used metal. Accordingly, the discovery of an appropriate laminated structure constituted of a plurality of metals has been sought.

A need thus exists for a piezoelectric device which is not susceptible to the drawback mentioned above.

SUMMARY

According to this disclosure, a piezoelectric device includes a piezoelectric vibrating piece, a lid portion, and a base portion. The piezoelectric vibrating piece includes a vibrating portion, a framing portion surrounding the vibrating portion, an excitation electrode disposed in the vibrating portion, and an extraction electrode electrically connected to the excitation electrode. The extraction electrode is disposed in the framing portion. The lid portion is bonded to a front surface of the piezoelectric vibrating piece via a bonding material. The base portion includes an external electrode bonded to a back surface of the piezoelectric vibrating piece via a bonding material. The external electrode is electrically connected to the extraction electrode. The excitation electrode and the extraction electrode each include a foundation film formed of metal to be rendered passive, and a first metal film and a second metal film laminated to the foundation film. The foundation film has a film with a thickness of 1.0 nm to 8.0 nm.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1:
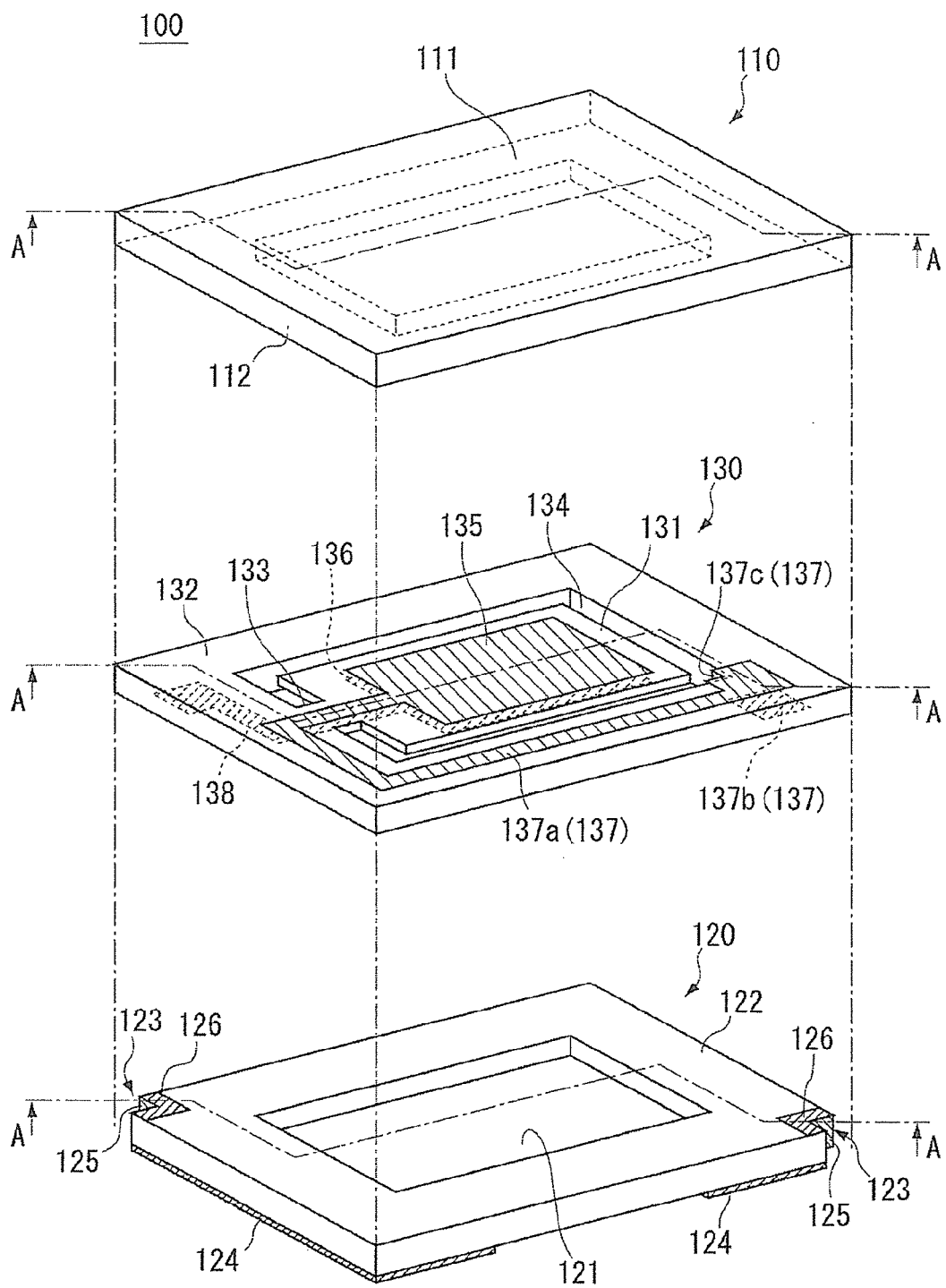
FIG. 1 is an exploded perspective view of a piezoelectric device according to an embodiment.

Hereinafter, a description will be given of an embodiment disclosed here with the reference to the accompanying drawings. However, this disclosure is not limited to this. In order to describe the embodiment, the drawings are expressed by changing the scale as necessary. For example, the illustration is partially enlarged or emphasized. In the drawings, a hatched portion represents a conductive metal film and bonding material.

Configuration of Piezoelectric Device 100

A description will be given of a piezoelectric device 100 according to this embodiment.

Figure 2:
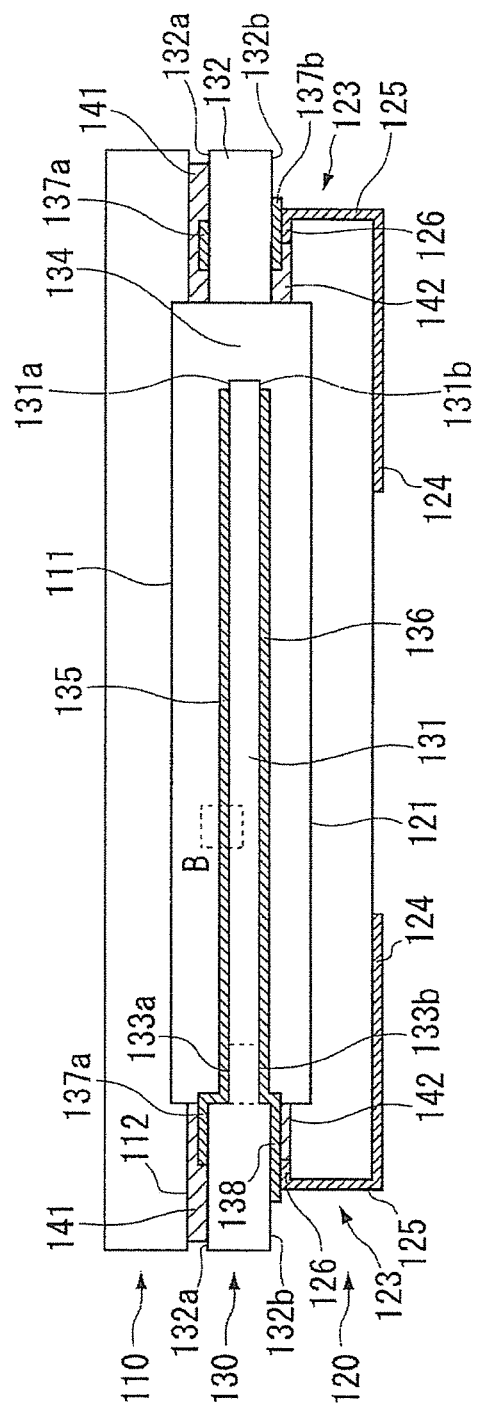
FIG. 2 is a cross-sectional view taken along the line A-A of FIG. 1.

As illustrated in FIG. 1 and FIG. 2, the piezoelectric device 100 includes a lid portion 110, a piezoelectric vibrating piece 130, and a base portion 120. In the following description, the axial direction of a piezoelectric vibrating piece 130 is taken as a reference. The longitudinal direction of the piezoelectric device 100 denotes the X-axis direction. The height direction of the piezoelectric device 100 denotes the Y-axis direction. A direction perpendicular to the X and Y-axis directions, that is, the short side direction of the piezoelectric device 100 denotes the Z-axis direction.

The lid portion 110, the base portion 120, and the piezoelectric vibrating piece 130 employ, for example, an AT-cut quartz-crystal material. AT-cut has advantages that satisfactory frequency characteristics are obtained when a piezoelectric device such as a crystal unit is used at around ordinary temperature for example, and is a processing method for cutting out the quartz crystal at an angle inclined at 35°15' around the crystallographic axis with respect to the optical axis among the electric axis, the mechanical axis, and the optical axis, which are three crystallographic axes of the synthetic quartz crystal.

The lid portion 110 is formed in a rectangular plate shape as illustrated in FIG. 1 and FIG. 2, and includes a depressed portion 111 formed on the back surface (the surface at −Y side) and a bonding surface 112 that surrounds the depressed portion 111. The bonding surface 112 faces a front surface 132a, which is described later, of the framing portion 132 of the piezoelectric vibrating piece 130. The lid portion 110 is bonded to the front surface of the piezoelectric vibrating piece 130 (the surface at +Y side) by a bonding material 141. The bonding material 141 is disposed between the bonding surface 112 and the front surface 132a of the framing portion 132 as illustrated in FIG. 2.

The base portion 120 is formed in a rectangular plate shape as illustrated in FIG. 1 and FIG. 2, and includes a depressed portion 121 formed on the front surface (the surface at +Y side) and a bonding surface 122 that surrounds the depressed portion 121. The bonding surface 122 faces a back surface 132b, which is described later, of the framing portion 132 of the piezoelectric vibrating piece 130. As illustrated in FIG. 2, the base portion 120 is bonded to the back surface (the surface of −Y side) of the piezoelectric vibrating piece 130 by a bonding material 142. The bonding material 142 is disposed between the bonding surface 122 and the back surface 132b of the framing portion 132.

Furthermore, respective castellations 123 (cutout portions) are formed in two diagonal corner portions (a corner portion at +X side and +Z side, and a corner portion at −X side and −Z side) among four corner portions of the base portion 120. At the back surface (the surface at −Y side) of the base portion 120, respective external electrodes 124 are disposed as a pair of mounting terminals. A castellation electrode 125 is formed on the surface of the castellation 123. Furthermore, a connection electrode 126 is formed on the surface of the base portion 120 and in a region surrounding the castellation 123. This connection electrode 126 and the external electrode 124 are electrically connected together via the castellation electrode 125

The external electrode 124, the castellation electrode 125, and the connection electrode 126 are formed by conductive metal films. The conductive metal film has, for example, a three-layer structure where a chrome (Cr) layer, a nickel tungsten (Ni—W) layer, and a gold (Au) layer are laminated in this order. In this case, the chrome layer is excellent in adhesion to the quartz-crystal material used for the base portion 120, and used for improving the corrosion resistance of the metal film by diffusing to the nickel tungsten layer after film formation so as to form a passivation film (an oxide film) on the exposed surface of the nickel tungsten layer. The nickel tungsten layer is used for suppressing diffusion of chrome atoms to the gold layer. The gold layer is used for improving the conductive property and the stability of the metal film.

The conductive metal film may employ a two-layer configuration where the nickel tungsten layer and the gold layer are formed in this order. In the case where the metal film employs the three-layer structure, for example, aluminum (Al), titanium (Ti), or alloy of these materials may be used instead of chrome. Additionally, for example, nickel (Ni) or tungsten (W) may be used instead of nickel tungsten. Additionally, for example, silver (Ag) may be used instead of gold.

The external electrode 124, the castellation electrode 125, and the connection electrode 126 are formed integrally as a film, for example, by sputtering using a metal mask. However, the external electrode 124, the castellation electrode 125, and the connection electrode 126 may be formed separately from each other. For example, the external electrode 124 may be preliminarily formed on the back surface of the base portion 120. Subsequently, the castellation electrode 125 and connection electrode 126 may be disposed to connect to this external electrode 124. Here, the metal film may be formed by using vacuum evaporation instead of sputtering.

The connection electrode 126 formed in the base portion 120 connects to extraction electrodes 137b and 138, which are described later, of the piezoelectric vibrating piece 130. Accordingly, these extraction electrodes 137b and 138 and the external electrode 124 are electrically connected together via the connection electrode 126 and the castellation electrode 125. However, the connection configuration is not limited to the configuration using this connection electrode 126. For example, the base portion 120 is bonded to the piezoelectric vibrating piece 130, and then the external electrode 124 is formed. At this time, a metal film that extends from this external electrode 124 via the castellation 123 to the extraction electrodes 137b and 138 may be used for the connection configuration.

The piezoelectric vibrating piece 130 includes a vibrating portion 131 that vibrates at a predetermined vibration frequency, a framing portion 132 that surrounds the vibrating portion 131, a connecting portion 133 that connects the vibrating portion 131 and the framing portion 132 together. A through hole 134 is formed between the vibrating portion 131 and the framing portion 132. The through hole 134 passes through the piezoelectric vibrating piece 130 in the Y-axis direction. The vibrating portion 131 and the connecting portion 133 each have a thinner thickness in the Y-axis direction compared with the framing portion 132. The piezoelectric vibrating piece 130 is formed in a rectangular shape as a whole. The rectangular shape has long sides in the X-axis direction and short sides in the Z-axis direction.

Respective excitation electrodes 135 and 136 are formed on a front surface 131a (a surface at +Y side) and a back surface 131b (a surface at −Y side) in the vibrating portion 131 of the piezoelectric vibrating piece 130. Also, extraction electrodes 137 and 138 are formed to electrically connect to the respective excitation electrodes 135 and 136 at a front surface 132a (a surface at +Y side) and a back surface 132b (a surface at −Y side) in the framing portion 132 of the piezoelectric vibrating piece 130. As illustrated in FIG. 2, the extraction electrode 137 includes an extraction electrode 137a. The extraction electrode 137a is extracted from the excitation electrode 135 through a front surface 133a (the surface at +Y side) of the connecting portion 133 to the front surface 132a of the framing portion 132 in the −X-axis direction. Subsequently, the extraction electrode 137a extends at the front surface 132a in the +Z-axis direction, and then is formed to be bent back and extracted in the +X-axis direction to a region at the +X side and the +Z side of the front surface 132a. Furthermore, the extraction electrode 137 includes a rectangular extraction electrode 137b. The extraction electrode 137b is formed from the extraction electrode 137a via an extraction electrode 137c, which is formed on an inner surface of the framing portion 132, to the back surface 132b of the framing portion 132. This extraction electrode 137 is formed away from the outer peripheral edge of the framing portion 132.

As illustrated in FIG. 2, the extraction electrode 138 is extracted from the excitation electrode 136 through a back surface 133b (a surface at −Y side) of the connecting portion 133 to the back surface 132b of the framing portion 132 in the −X-axis direction. Subsequently, the extraction electrode 138 is extracted at this back surface 132b in the −Z-axis direction to a region at the −X side and the −Z side of the back surface 132b. This extraction electrode 138 is formed away from the outer peripheral edge of the framing portion 132 similarly to the extraction electrode 137.

As illustrated in FIG. 2, the extraction electrode 137a is covered with the bonding material 141 when the lid portion 110 is bonded to the piezoelectric vibrating piece 130, and thus is not exposed to the exterior. The extraction electrode 138 is covered with the bonding material 142 excluding a portion connected to the connection electrode 126 when the base portion 120 is bonded to the piezoelectric vibrating piece 130.

Figure 3:
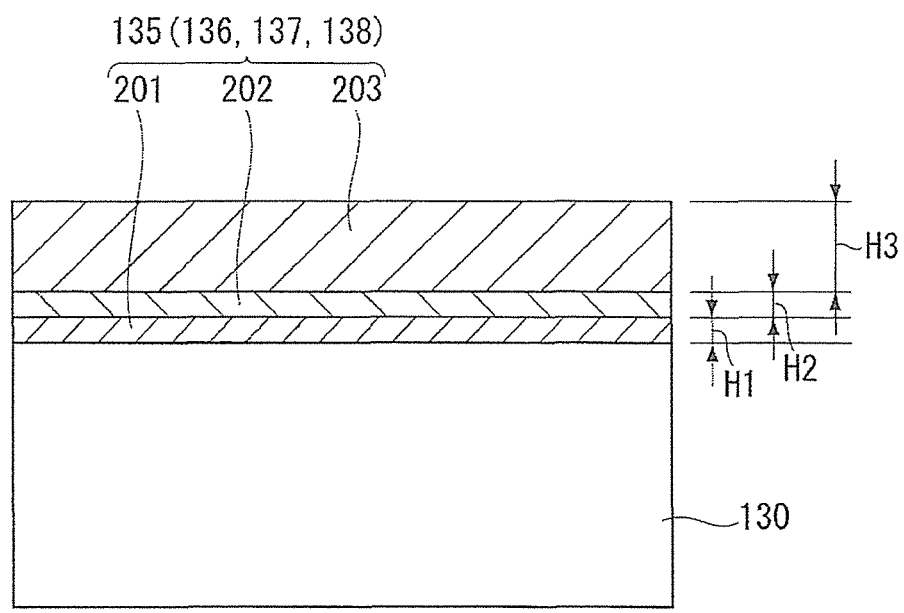
FIG. 3 is a cross-sectional view where a region B in FIG. 2 is enlarged.
Figure 3:
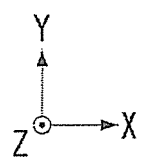

The excitation electrodes 135 and 136 and the extraction electrodes 137 and 138 formed in the piezoelectric vibrating piece 130 are formed of conductive metal films. The excitation electrode 135 and extraction electrode 137 are formed as an integrated metal film. The excitation electrode 136 and extraction electrode 138 are formed as an integrated metal film. As illustrated in FIG. 3, this metal film employs a three-layer structure that includes: a foundation film 201 formed on the front surface of the quartz-crystal material, which is the piezoelectric vibrating piece 130, a first metal film 202 laminated to this foundation film 201, and a second metal film 203 laminated to this first metal film 202. The excitation electrodes 135 and 136 and the extraction electrodes 137 and 138 are formed of the same film configuration.

The foundation film 201 employs a metallic material that can be rendered passive, and is used to improve the adhesion to the crystal element constituting the piezoelectric vibrating piece 130. As the metallic material that can be rendered passive, chrome (Cr) may be employed. Instead of chrome (Cr), for example, aluminum (Al), titanium (Ti), or alloy of these materials may be used. The metal (such as chrome atoms) included in the foundation film 201 diffuses to the first metal film 202, and then forms a passivation film (an oxide film) on the exposed surface of the first metal film 202 so as to improve the corrosion resistance of the first metal film 202.

The first metal film 202 functions as what is called a barrier film that suppresses diffusion of the metal atoms included in the foundation film 201 to the second metal film 203. The metallic material constituting the first metal film 202 employs nickel tungsten (Ni—W). Instead of nickel tungsten (Ni—W), for example, nickel (Ni) or tungsten (W) may be used.

The second metal film 203 has a function that ensures conductive properties of the excitation electrodes 135 and 136 and the extraction electrodes 137 and 138 while protecting the electrodes. The metallic material constituting the second metal film 203 employs gold (Au). Instead of gold (Au), for example, silver (Ag) may be used. The foundation film 201, the first metal film 202, and the second metal film 203 are formed by sputtering using a metal mask or a resist mask by photolithography. Instead of film formation by sputtering, vacuum evaporation may be used.

As illustrated in FIG. 3, the foundation film 201, the first metal film 202, and the second metal film 203 are respectively designed to have film thicknesses H1, H2, and H3. These film thicknesses H1, H2, and H3 are designed as the same in the excitation electrodes 135 and 136 and the extraction electrodes 137 and 138. However, this should not be construed in a limiting sense. The film thicknesses H1, H2, and H3 may be partially different. For example, the film thickness H1 of the foundation film 201 may be designed to be thin in the excitation electrodes 135 and 136 while the film thickness H1 of the foundation film 201 is designed to be thick in the extraction electrodes 137 and 138. The respective film thicknesses H1, H2, and H3 are lengths in the Y-axis direction in the excitation electrodes 135 and 136 and the extraction electrodes 137a, 137b, and 138, and are lengths in the X-axis direction and the Z-axis direction in the extraction electrode 137c.

The film thickness H1 of the foundation film 201 is designed to be from 1.0 nm to 8.0 nm. In the case where the film thickness H1 is less than 1.0 nm, it is difficult to form a uniform and stable film as the foundation film 201 and the adhesion to the quartz-crystal material might not be maintained. Furthermore, the absolute amount of the metal (such as chrome) constituting the foundation film 201 falls short. This reduces the amount of metal atoms (such as chrome atoms) diffusing from the foundation film 201 to the first metal film 202. The passivation film (the oxidized film) formed on the exposed surface of the first metal film 202 might not be sufficiently formed. Accordingly, corrosion resistance of the first metal film 202 is not ensured (that is, the erosion resistance is low) and the durability of the metal films (especially the extraction electrode 137b and the extraction electrode 138) is degraded. As a result, this reduces reliability of the piezoelectric device 100. If the amount of the metal constituting the foundation film 201 is small, the metal atoms diffuse to the first metal film 202 and the metal remaining in the foundation film 201 is reduced. It may be considered that the adhesion to the quartz-crystal material is damaged.

On the other hand, in the case where the film thickness H1 of the foundation film 201 is equal to or more than 1.0 nm, a stable film can be formed as the foundation film 201. This allows maintaining the adhesion to the quartz-crystal material. Furthermore, the metal atoms constituting the foundation film 201 sufficiently diffuse to the first metal film 202. Accordingly, the passivation film is formed on the exposed surface of the first metal film 202. This allows ensuring corrosion resistance of the first metal film 202 (that is, increasing the erosion resistance).

In the case where the film thickness H1 of the foundation film 201 exceeds 8.0 nm, the amount of the metal constituting the foundation film 201 increases. This increases the amount of the metal atoms diffusing from the foundation film 201 to the first metal film 202. As a result, a large number of the metal atoms of the foundation film 201 invade the second metal film 203 beyond the first metal film 202. This increases the resistance values of the excitation electrodes 135 and 136 and the extraction electrodes 137 and 138, and causes increase in CI value so as to degrade the characteristics of the piezoelectric device 100. Furthermore, in the case where the film thickness H1 of the foundation film 201 is thick, the respective film thicknesses of the excitation electrodes 135 and 136 also become thick. This varies the vibration characteristic of the vibrating portion 131.

On the other hand, in the case where the film thickness H1 of the foundation film 201 is equal to or less than 8.0 nm, the amount of the metal atoms diffusing to the first metal film 202 decreases. Thus, the amount of the metal atoms invading the second metal film 203 decreases. This suppresses increase in resistance value at the excitation electrodes 135 and 136 and the extraction electrodes 137 and 138. Accordingly, the characteristics of the piezoelectric device 100 are not degraded. Furthermore, the respective film thicknesses of the excitation electrodes 135 and 136 that are formed in the vibrating portion 131 do not become excessively thick. Thus, the influence on the vibration characteristic of the vibrating portion 131 is small.

Thus, designing the film thickness H1 of the foundation film 201 in a range of 1.0 nm to 8.0 nm maintains the adhesion to the quartz-crystal material while forming a passivation film (an oxidized film) on the exposed surface of the first metal film 202 so as to ensure corrosion resistance of the first metal film 202. In addition, this reduces the amount of the metal atoms of the foundation film 201 diffusing into the first metal film 202 and the second metal film 203, so as to suppress increase in resistance value of the excitation electrodes 135 and 136 and the extraction electrodes 137 and 138. This prevents degradation in characteristics of the piezoelectric device 100.

Here, the film thickness H1 of the foundation film 201 may be designed to be from 3.0 nm to 7.5 nm. Designing the film thickness H1 to be equal to or more than 3.0 mm allows the metal atoms constituting the foundation film 201 to sufficiently and surely diffuse to the first metal film 202. This allows more surely forming the passivation film on the exposed surface of the first metal film 202. Designing the film thickness H1 to be equal to or more than 3.0 nm sufficiently ensures adhesion to the quartz-crystal material.

Additionally, designing the film thickness H1 of the foundation film 201 to be equal to or less than 7.5 nm further reduces the amount of the metal atoms of the foundation film 201 diffusing into the first metal film 202 and the second metal film 203. This surely suppresses increase in resistance value at the excitation electrodes 135 and 136 and the extraction electrodes 137 and 138, thus surely preventing degradation in characteristics of the piezoelectric device 100. Therefore, this keeps the resistance values to within a range that in general enables the provision of the piezoelectric device 100. Furthermore, the respective film thicknesses of the excitation electrodes 135 and 136 that are formed in the vibrating portion 131 also become thin. This further reduces the influence on the vibration characteristic of the vibrating portion 131.

Next, the film thickness H2 of the first metal film 202 is designed to be from 0.5 nm to 12.5 nm. In the case where the film thickness H2 is less than 0.5 nm, it is difficult to form a uniform metal film (for example, a nickel tungsten film) in the film formation process of the first metal film 202. This is liable to cause not only a non-uniform film thickness after the film formation, but also a state in which the film is partially unformed. Therefore, the first metal film 202 does not effectively provide the function as what is called a barrier film that suppresses diffusion of the metal atoms forming the foundation film 201 to the second metal film 203.

On the other hand, in the case where the film thickness H2 of the first metal film 202 is equal to or more than 0.5 nm, the uniform first metal film 202 is formed. This suppresses diffusion of the metal atoms constituting the foundation film 201 to the second metal film 203. Thus, the first metal film 202 can effectively function as what is called a barrier film. Here, the diffusion of the metal atoms of the foundation film 201 to the first metal film 202 forms the passivation film (the oxidized film) on the exposed surface of the first metal film 202, thus ensuring the corrosion resistance.

In the case where the film thickness H2 of the first metal film 202 exceeds 12.5 nm, the film thickness H2 is thick. Therefore, a sufficient amount of the metal atoms does not reach the exposed surface of the first metal film 202 even when the metal atoms constituting the foundation film 201 diffuse to the first metal film 202. The passivation film formed on the exposed surface of the first metal film 202 also turns out to be insufficient. As a result, the corrosion resistance of the first metal film 202 is not ensured (that is, the erosion resistance is low). This degrades the reliability of the piezoelectric device 100.

On the other hand, in the case where the film thickness H2 of the first metal film 202 is equal to or less than 12.5 nm, the metal atoms constituting the foundation film 201 diffuse to the first metal film 202 and a sufficient amount of the metal atoms can reach the exposed surface of the first metal film 202 so as to form the passivation film on the exposed surface. Therefore, the corrosion resistance of the first metal film 202 is ensured (that is, the erosion resistance is high). This ensures the reliability of the piezoelectric device 100.

Thus, designing the film thickness H2 of the first metal film 202 to be in a range of 0.5 nm to 12.5 nm can form the passivation film on the exposed surface of the first metal film 202 and can ensure the corrosion resistance of the first metal film 202, thus improving the reliability of the piezoelectric device 100.

The film thickness H2 of the first metal film 202 may be designed to be in a range of 2.5 nm to 10.0 nm. In the case where the film thickness H2 is equal to or more than 2.5 nm, the uniform first metal film 202 is surely formed. This surely suppresses diffusion of the metal atoms constituting the foundation film 201 to the second metal film 203. Thus, the first metal film 202 can more effectively function as what is called a barrier film. Also, in the case where the film thickness H2 of the first metal film 202 is equal to or more than 2.5 nm, diffusion of the metal atoms of the foundation film 201 to the first metal film 202 forms the passivation film (the oxidized film) on the exposed surface of the first metal film 202, thus ensuring the corrosion resistance.

Designing the film thickness H2 of the first metal film 202 to be equal to or less than 10.0 nm allows the metal atoms constituting the foundation film 201 to easily reach the exposed surface of the first metal film 202 by diffusing to the first metal film 202. This surely forms the passivation film on this exposed surface. Therefore, this ensures sufficient corrosion resistance of the first metal film 202, thus ensuring the reliability of the piezoelectric device 100.

Thus, designing the film thickness H2 of the first metal film 202 to be in a range of 2.5 nm to 10.0 nm can surely form the passivation film on the exposed surface of the first metal film 202 and can ensure sufficient corrosion resistance of the first metal film 202, so as to further improve the reliability of the piezoelectric device 100. The film thickness H3 of the second metal film 203 (for example, a gold film) is designed to be 100.0 nm or 128.0 nm. The value of the film thickness H3 is not specifically limited insofar as the value is within a range that provides the functions and the effects as the excitation electrodes 135 and 136 and the extraction electrodes 137 and 138.

With the configuration of the piezoelectric device 100 according to this embodiment, specifying the film thickness H1 of the foundation film 201 forms the passivation film on the exposed surface of the first metal film 202 so as to improve the corrosion resistance of the metal film while suppressing reduction of the adhesion of this metal film, increase in resistance value, and the influence on the vibration characteristic the vibrating portion 131. This prevents degradation in characteristics of the piezoelectric device 100. Additionally, specifying the film thickness H2 of the first metal film 202 ensures the passivation film formed on the exposed surface of the first metal film 202 so as to improve the corrosion resistance (that is, increase the erosion resistance) of the extraction electrodes 137 and 138 and similar member. This improves the reliability of the piezoelectric device 100. In the case where the extraction electrodes 137 and 138 are formed away from the outer peripheral edge of the framing portion 132, the first metal film 202 is coated by the bonding materials 141 and 142 excluding the portion connected to the connection electrode 126. Thus, the first metal film 202 is protected from water vapor in the atmosphere. If the bonding material 141 and similar member is damaged, the passivation film is formed by the first metal film 202 coming into contact with the outside air. Thus, the corrosion resistance of the first metal film 202 is maintained.

Fabrication Method of the Piezoelectric Device 100

Next, a description will be given of a fabrication method of the piezoelectric device 100 constituted described above. Multiple piezoelectric vibrating pieces 130 are taken by cutting out the individual piezoelectric vibrating pieces 130 from a piezoelectric wafer fabricated, for example, by AT-cut of the synthetic quartz crystal. Similarly, multiple lid portions 110 and multiple base portions 120 are taken by cutting out the individual portions from a lid wafer and a base wafer that are fabricated by AT-cut. The respective processings on the piezoelectric wafer, the lid wafer, and the base wafer are performed in parallel for example.

In the piezoelectric wafer, a thickness of a region including the vibrating portion 131 is adjusted such that the vibrating portion 131 constituting the piezoelectric vibrating piece 130 has a desired frequency characteristic. This thickness adjustment is performed, for example, by etching the region including the vibrating portion 131 among the piezoelectric wafer. Subsequently, the vibrating portion 131, the framing portion 132, and the connecting portion 133 are formed on the piezoelectric wafer by photolithography and etching.

Subsequently, the excitation electrodes 135 and 136 and the extraction electrodes 137 and 138 are formed in the vibrating portion 131, the framing portion 132, and the connecting portion 133 on the piezoelectric wafer. Regarding these electrodes, for example, a film of chrome is first formed as the foundation film 201 at the front surface of the piezoelectric wafer (the crystal element) in the film thickness H1 (in a range of 1.0 nm to 8.0 nm or in a range of 3.0 nm to 7.5 nm). Subsequently, for example, a film of nickel tungsten is formed as the first metal film 202 at the front surface of the foundation film 201 in the film thickness H2 (in a range of 0.5 nm to 12.5 nm or in a range of 2.5 nm to 10.0 nm). Subsequently, for example, a film of gold is formed as the second metal film 203 at the front surface of the first metal film 202 in the film thickness H3 (for example, in a range of 100.0 nm to 128.0 nm).

The method for forming the foundation film 201, the first metal film 202, and the second metal film 203 may employ, for example, various methods such as a method for forming resist patterns of the respective metal films by photolithography and etching in addition to the method for sequentially forming the metal films by sputtering or vacuum evaporation using a metal mask.

On the lid wafer, the respective depressed portions 111 are formed by photolithography and etching. On the base wafer, the respective depressed portions 121 are form by photolithography and etching, and opening portions for forming the castellations 123 are formed. Furthermore, on the base wafer, the external electrodes 124, the castellation electrodes 125, and the connection electrodes 126 are formed in predetermined portions, for example, by sputtering using a metal mask.

Subsequently, under vacuum atmosphere, the lid wafer is bonded to the front surface of the piezoelectric wafer via the bonding material 141. Furthermore, the base wafer is bonded to the back surface of the piezoelectric wafer via the bonding material 142. Subsequently, the bonded wafers are cut along preliminarily designed scribe lines to complete the individual piezoelectric devices 100. Here, the fabrication method of the piezoelectric device 100 is not limited to the above-described method, and can employ various methods.

The embodiment has been described above. However, this disclosure is not limited to the above-described embodiment, and various changes of the embodiment may be made without departing from the spirit and scope of the disclosure. While in the above-described embodiment the crystal unit (a piezoelectric resonator) is described as the piezoelectric device, an oscillator is also possible. In the case of the oscillator, for example, an IC or similar member is mounted on the base portion 120. The extraction electrodes 137 and 138 and similar member in the piezoelectric vibrating piece 130 and the external electrode 124 of the base portion 120 each connect to the IC. Additionally, the above-described embodiment employs the quartz crystal piece as the piezoelectric vibrating piece 130. However, a piezoelectric vibrating piece formed of lithium tantalite, lithium niobate, and similar material may be used instead. Additionally, the lid portion 110 and the base portion 120 each employ the quartz-crystal material. However, glass, ceramic, or similar material may be used instead.

WORKING EXAMPLE

Hereinafter, a specific description will be given using working examples. However, this disclosure is not limited to the following working examples. The working examples and comparative examples were evaluated as follows.

Figure 4:
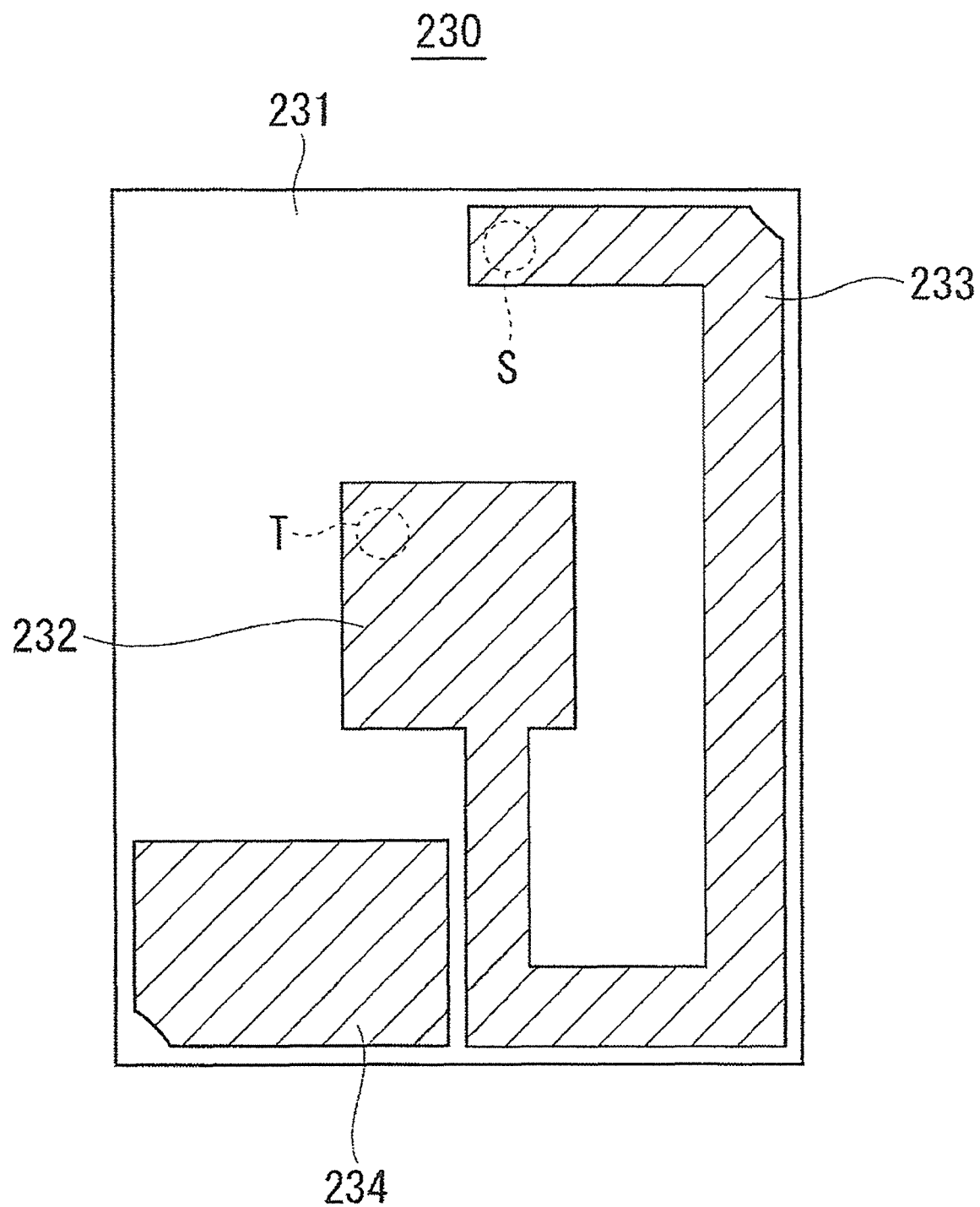
FIG. 4 is a plan view of an evaluation sample.

As illustrated in FIG. 4, an evaluation sample 230 used in this evaluation employs a PL wafer 231 formed in a rectangular plate shape using a quartz-crystal material. A resist pattern of a metal film is formed on the front surface of the wafer. This metal film includes a center electrode 232, a peripheral electrode 233, and a rectangular electrode 234. The center electrode 232 is formed in a central region of the PL wafer 231. The peripheral electrode 233 is extracted from the center electrode 232 to be formed on the periphery of the central region. These electrodes are models of the back surface (the surface at −Y side) of the piezoelectric vibrating piece 130 illustrated in FIG. 1. The center electrode 232 corresponds to the excitation electrode 136. The peripheral electrode 233 corresponds to the extraction electrode 138. The rectangular electrode 234 corresponds to the extraction electrode 137b.

The center electrode 232, the peripheral electrode 233, and the rectangular electrode 234 are each of metal films in the three-layer structure where the foundation film, the first metal film, and the second metal film are laminated in this order. These metal films are formed by, for example, sputtering using a metal mask. The center electrode 232, the peripheral electrode 233, and the rectangular electrode 234 have the same configuration of the metal thickness. The foundation film employs chrome (Cr). The first metal film employs nickel tungsten (NiW). The second metal film employs gold (Au).

Table 1 shows working examples 1 to 11 and comparative examples 0, 12, and 13 by varying the film thicknesses of chrome, nickel tungsten, and gold. As shown in Table 1, the respective film thicknesses of chrome (Cr)/nickel tungsten (NiW)/gold (Au) from the quartz-crystal side are described as the film configuration. Here, the comparative example 0 is a metal film in a two-layer structure where nickel tungsten and gold are laminated to the PL wafer 231 in this order without formation of Cr as the foundation film. Only numbers are described in the left column of Table 1.

TABLE 1

| No. | Film configuration | Film thickness |
|---|---|---|
| 0 | Cr/NiW/Au | 0/15.0/100.0 nm |
| 1 | Cr/NiW/Au | 1.0/10.0/128.0 nm |
| 2 | Cr/NiW/Au | 1.0/7.5/128.0 nm |
| 3 | Cr/NiW/Au | 1.0/2.5/128.0 nm |
| 4 | Cr/NiW/Au | 3.0/7.5/128.0 nm |
| 5 | Cr/NiW/Au | 3.0/10.0/128.0 nm |
| 6 | Cr/NiW/Au | 3.0/7.5/100.0 nm |
| 7 | Cr/NiW/Au | 3.0/3.0/100.0 nm |
| 8 | Cr/NiW/Au | 3.0/15.0/100.0 nm |
| 9 | Cr/NiW/Au | 3.0/2.5/128.0 nm |
| 10 | Cr/NiW/Au | 7.5/15.0/100.0 nm |
| 11 | Cr/NiW/Au | 7.5/7.5/100.0 nm |
| 12 | Cr/NiW/Au | 15.0/15.0/100.0 nm |
| 13 | Cr/NiW/Au | 15.0/15.0/250.0 nm |

*1. In the order of films, quartz-crystal is disposed at left side (Quartz crystal - Film configuration - Outside air).
*2. In No. 0, Cr = 0 means that Cr is not attached.

Regarding the working examples 1 to 11 and the comparative examples 0, 12, and 13, as illustrated in FIG. 4, a measuring probe is brought into contact with a region S on the peripheral electrode 233 and a region T on the center electrode 232 for each evaluation sample 230 so as to measure a resistance value across S-T. This resistance value corresponds to a resistance value between the excitation electrode 136 and the extraction electrode 138 in the piezoelectric vibrating piece 130 illustrated in FIG. 1. For data reliability, each evaluation sample 230 is measured 10 times. The average value is used as the resistance value.

Figure 5:
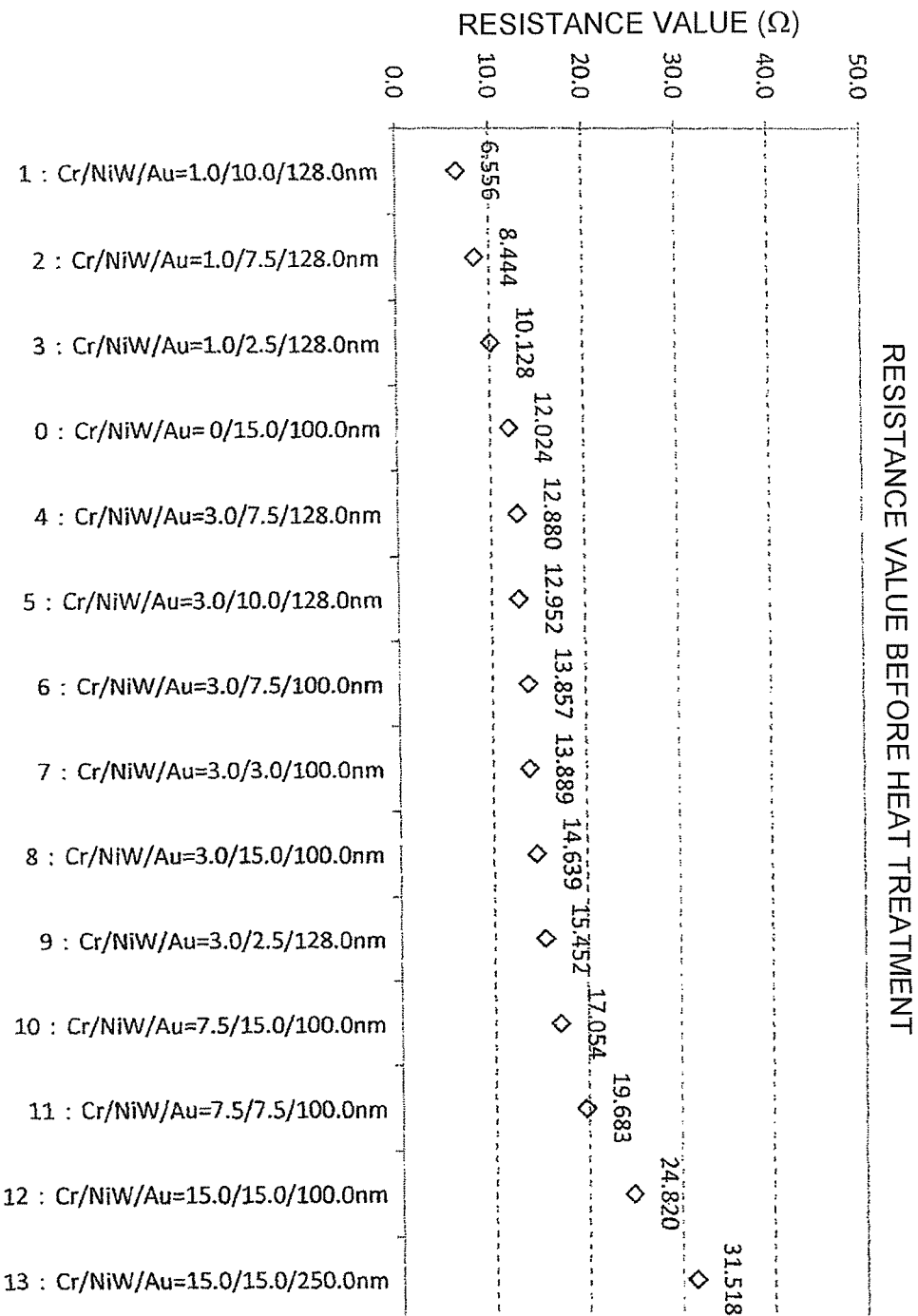
FIG. 5 is a graph illustrating a measurement result of resistance values before heat treatment.

FIG. 5 shows respective resistance values of the working examples 1 to 11 and the comparative examples 0, 12, and 13. The respective resistance values shown in FIG. 5 are values before heat treatment. As seen in FIG. 5, it was confirmed that the respective resistance values were equal to or less than 20Ω in the working example 1 to 11 while the respective resistance values exceeded 24Ω in the comparative example 12 and the comparative example 13. Accordingly, it was confirmed that increase in resistance value was suppressed in the working example 1 to 11 with the respective film thicknesses of chrome designed to be from at least 1.0 nm to 7.5 nm compared with the comparative examples 12 and 13. This difference in resistance value becomes more significant by performing heat treatment.

Figure 6:
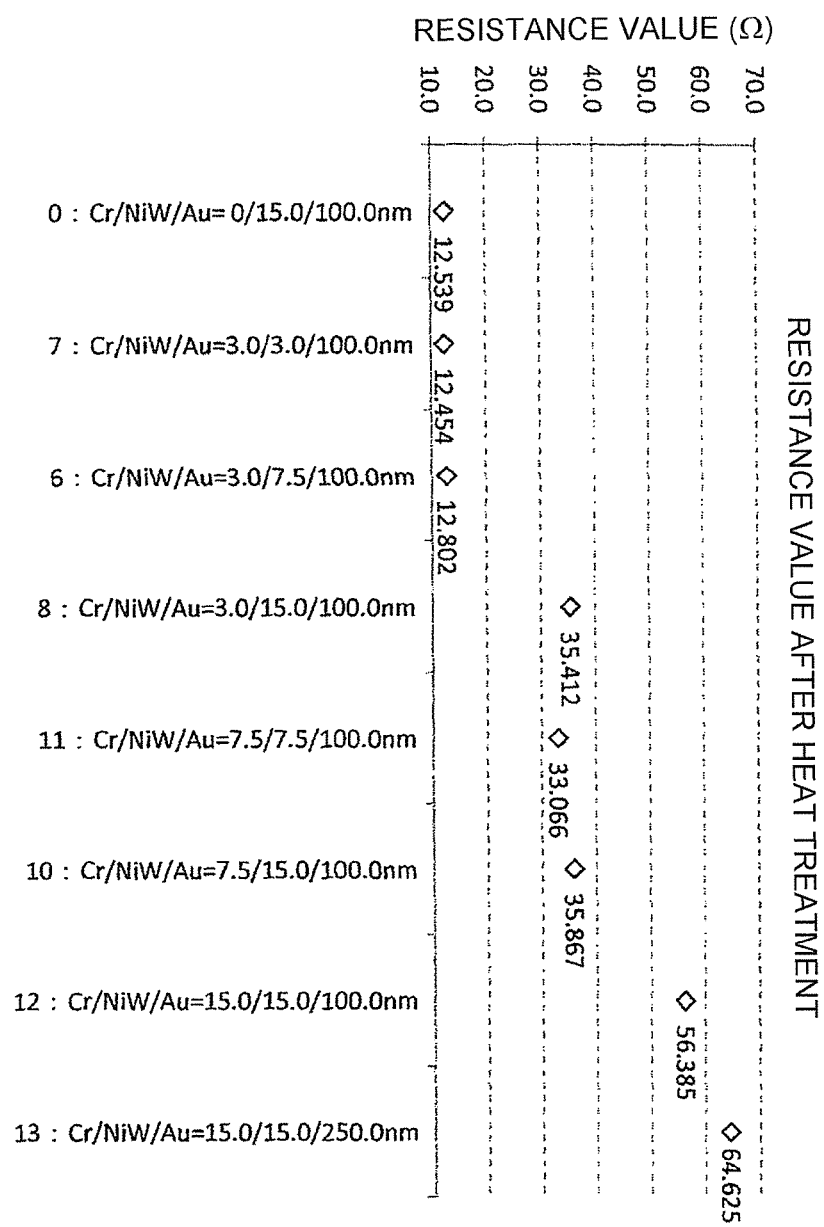
FIG. 6 is a graph illustrating a measurement result of resistance values after heat treatment.

FIG. 6 shows the respective resistance values after heat treatment. Here, a description will be given of the heat treatment. On the evaluation sample 230, first heat treatment was performed with a lid-bonding device under conditions of 500N, a vacuum atmosphere, 375° C., and a 10-minute duration. Subsequently, second heat treatment was performed with the lid-bonding device under conditions of 500N, a vacuum atmosphere, 365° C., and a 10-minute duration. This heat treatment corresponds to the process for bonding the lid portion 110 and the base portion 120 to the piezoelectric vibrating piece 130 in the fabrication process of the piezoelectric device 100. Here, FIG. 6 shows the working examples 6 to 8, 10, and 11 and the comparative examples 0, 12, and 13.

As illustrated in FIG. 6, in the working examples 6 and 7, the respective resistance values were equal to or less than 13Ω. In the working examples 8, 10, and 11, the respective resistance values were equal to or less than 36Ω. In contrast, in the comparative examples 12 and 13, it was confirmed that the respective resistance values had significantly large values that were equal to or more than 56Ω. Thus, as also seen from the result after heat treatment, that the working examples 6 to 8, 10, and 11 with the respective film thicknesses of chrome at least designed equal to or less than 7.5 nm were confirmed to reduce the increase in resistance value compared with the comparative examples 12 and 13. Therefore, also in the case where the film thickness of chrome is designed equal to or less than 8.0 nm, the increase in resistance value is presumed to be suppressed.

Next, each evaluation sample 230 after heat treatment was immersed in warm pure water at 90° C. for 20 hours. Then, an eroded state of the film of nickel tungsten (the first metal film) was observed to evaluate the degree of corrosion. The metal film after heat treatment was scratched by tweezers so as to evaluate the physical strength and the adhesion strength of the film, as a scratch test.

Table 2 shows the result of the erosion of NiW immersed in warm water and the result of the scratch test regarding the working examples 1 to 11 and the comparative examples 12 and 13. These results show the evaluation result of erosion resistance (corrosion resistance). The result is shown as "O(Good)" or "x(Poor)". In the erosion of NiW immersed in warm water of Table 2, the determination of "O" or "x" was made. The result in the case where similar immersion treatment is performed on the comparative example 0 was taken as a reference. The determination of "O" was made in the case where the erosion was reduced. In contrast, the determination of "x" was made in the case where the erosion had progressed. Also in the scratch test, the result of the scratch test in the comparative example 0 was taken as a reference. The better case was determined as "O". In contrast, the worse case was determined as "x".

The erosion resistance was evaluated as "O" in the case where the erosion resistance was provided, or evaluated as "x" in the case where the erosion resistance was not provided. In the determination of the erosion resistance, the erosion resistance was determined not to be provided (at low corrosion resistance) in the case where at least one of the results of the erosion of NiW immersed in warm water and the scratch test was "x". For example, in the case where the result of the erosion of NiW immersed in warn water was "O" and the result of the scratch test was "x", the weakened metal film was confirmed based on the result of the scratch test. Therefore, the metal film was considered to be in a state immediately prior to the result of the erosion of NiW immersed in warm water turning out "x" and to have an insufficient strength. Accordingly, it was determined that the erosion resistance was not provided and the determination of "x" was made.

TABLE 2

| | No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Au(nm) | 128.0 | 128.0 | 128.0 | 128.0 | 128.0 | 100.0 | 100.0 | 100.0 | 128.0 | 100.0 | 100.0 | 100.0 | 250.0 |
| NiW(nm) | 10.0 | 7.5 | 2.5 | 7.5 | 10.0 | 7.5 | 3.0 | 15.0 | 2.5 | 15.0 | 7.5 | 15.0 | 15.0 |
| Cr(nm) | 1.0 | 1.0 | 1.0 | 3.0 | 3.0 | 3.0 | 3.0 | 3.0 | 3.0 | 7.5 | 7.5 | 15.0 | 15.0 |
| Resistance value(Ω) | 6.556 | 8.444 | 10.128 | 12.880 | 12.952 | 13.875 | 13.889 | 14.639 | 15.452 | 17.054 | 19.683 | 24.820 | 31.518 |

TABLE 2-continued

| | No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Erosion of NiW immersed in warm water | ○ | ○ | ○ | ○ | ○ | ○ | ○ | X | ○ | ○ | ○ | ○ | ○ |
| Scratch test | ○ | ○ | ○ | ○ | ○ | ○ | ○ | X | ○ | X | ○ | X | ○ |
| Adhesion strength | ○ | ○ | ○ | ○ | ○ | ○ | ○ | X | ○ | X | ○ | X | ○ |

As shown in Table 2, in the working examples 8 and 10 and the comparative example 12, the respective erosion resistances were not provided. That is, like the working examples 8 and 10 and the comparative example 12, in the case where the film thickness of nickel tungsten was 15.0 mm, it was confirmed that the erosion resistance was not provided. In the working examples 1 to 7, 9, and 11, the respective film thicknesses of nickel tungsten were equal to or less than 10.0 nm. Regarding these examples, it was confirmed that the respective erosion resistances were provided. Therefore, in the case where the film thickness of nickel tungsten is equal to or less than 12.5 nm, the erosion resistance is presumed to be provided. Additionally, a thinner film thickness of nickel tungsten facilitates diffusion of chrome and forms the passivation film so as to improve the erosion resistance. Accordingly, in the case where the film thickness of nickel tungsten is equal to or more than 0.5 nm, the erosion resistance is presumed to be provided.

Based on the above-described results, it is clearly described that increase in resistance value is suppressed in the case where the film thickness of chrome as the foundation film is designed to be from 1.0 nm to 7.5 nm or designed to be from 1.0 nm to 8.0 nm. Furthermore, the erosion resistance is provided (the corrosion resistance becomes high) in the case where the film thickness of nickel tungsten as the first metal film is designed to be in a range of 2.5 nm to 10.0 nm or designed to be in a range of 0.5 nm to 12.5 nm.

Additionally, the piezoelectric device may be configured as follows. The foundation film may have a film thickness of 3.0 nm to 7.5 mm. The foundation film, the first metal film, and the second metal film may be laminated in this order in the excitation electrode and the extraction electrode, while the first metal film may be a barrier film that suppresses diffusion of metal atoms of the foundation film to the second metal film, and may have a film thickness of 0.5 mm to 12.5 nm. The first metal film may have a film thickness of 2.5 nm to 10.0 nm. The extraction electrode may be formed away from an outer peripheral edge of the framing portion.

According to this disclosure, the metal of the foundation film forms a passivation film at the outer peripheral edge portion of the extraction electrode. Thus, the extraction electrode is protected from water vapor in the atmosphere. This suppresses corrosion of the extraction electrode and similar trouble and prevents damage on the piezoelectric device, thus ensuring operation reliability. Furthermore, specifying the film thicknesses of the foundation film and the first metal film can reduce the influence on the vibration characteristic of the vibrating portion and increase in resistance value at the excitation electrode and similar electrode.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
    a piezoelectric vibrating piece that includes: a vibrating portion; a framing portion, surrounding the vibrating portion; an excitation electrode, disposed in the vibrating portion; and an extraction electrode, electrically connected to the excitation electrode, the extraction electrode being disposed in the framing portion;
    a lid portion, bonded to a front surface of the piezoelectric vibrating piece via a bonding material; and
    a base portion that includes an external electrode bonded to a back surface of the piezoelectric vibrating piece via a bonding material, the external electrode being electrically connected to the extraction electrode, wherein
    the excitation electrode and the extraction electrode each include:
        a foundation film, formed of metal to be rendered passive; and
        a first metal film and a second metal film, laminated to the foundation film, wherein
        the foundation film has a film with a thickness of 1.0 nm to 8.0 nm.
2. The piezoelectric device according to claim 1, wherein the foundation film has a film thickness of 3.0 nm to 7.5 nm.
3. The piezoelectric device according to claim 1, wherein the foundation film, the first metal film, and the second metal film are laminated in this order in the excitation electrode and the extraction electrode, and
    the first metal film is a barrier film that suppresses diffusion of metal atoms of the foundation film to the second metal film, the first metal film having a film thickness of 0.5 nm to 12.5 nm.
4. The piezoelectric device according to claim 3, wherein the first metal film has a film thickness of 2.5 nm to 10.0 nm.
5. The piezoelectric device according to claim 1, wherein the extraction electrode is formed away from an outer peripheral edge of the framing portion.

* * * * *